(12) United States Patent  
Wang et al.

(10) Patent No.: US 11,296,718 B2  
(45) Date of Patent: Apr. 5, 2022

(54) DIGITAL-TO-ANALOG CONVERSION CIRCUIT, DIGITAL-TO-ANALOG CONVERSION METHOD, AND DISPLAY APPARATUS

(71) Applicant: BOE TECHNOLOGY GROUP CO., LTD., Beijing (CN)

(72) Inventors: Tangxiang Wang, Beijing (CN); Chen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 8 days.

(21) Appl. No.: 16/766,602

(22) PCT Filed: Dec. 16, 2019

(86) PCT No.: PCT/CN2019/125623  
§ 371 (c)(1),  
(2) Date: May 22, 2020

(87) PCT Pub. No.: WO2020/143398  
PCT Pub. Date: Jul. 16, 2020

(65) Prior Publication Data  
US 2021/0159909 A1 May 27, 2021

(30) Foreign Application Priority Data

Jan. 10, 2019 (CN) .......................... 201910024295.9

(51) Int. Cl.  
*H03M 1/36* (2006.01)  
*G09G 3/20* (2006.01)

(52) U.S. Cl.  
CPC .............. *H03M 1/362* (2013.01); *G09G 3/20* (2013.01); *G09G 2310/027* (2013.01)

(58) Field of Classification Search  
CPC ...... H03M 1/362; H03M 1/765; H03M 1/365; G09G 3/20; G09G 2310/027  
(Continued)

(56) References Cited

U.S. PATENT DOCUMENTS 5,818,210 A * 10/1998 Ueno ...................... H03M 1/46  
    323/297  
7,369,075 B2 * 5/2008 Ishii ........................ H03M 1/76  
    341/144

(Continued)

FOREIGN PATENT DOCUMENTS

CN    101393730 A    3/2009  
CN    101425805 A    5/2009

(Continued)

OTHER PUBLICATIONS

Office Action issued in corresponding Chinese Patent Application No. 201910024295.9, dated May 8, 2020.

*Primary Examiner* — Jean B Jeanglaude  
(74) *Attorney, Agent, or Firm* — McDermott Will & Emery LLP

(57) ABSTRACT

Digital-to-analog conversion circuit, digital-to-analog conversion method, display apparatus are disclosed. Digital-to-analog conversion circuit may comprise: voltage dividing sub-circuit comprising M voltage dividing signal terminals; decoding sub-circuit comprising M input and output terminals, M input terminals electrically coupled to first to $M^{th}$ voltage dividing signal terminals of voltage dividing sub-circuit respectively, decoding sub-circuit configured to receive digital signal and select one of M input terminals to be electrically connected with output terminal according to digital signal; amplification sub-circuit comprising input and output terminals, input terminal of amplification sub-circuit electrically coupled to output terminal of decoding sub-circuit, amplification sub-circuit configured to amplify sig- (Continued)

nal at its input terminal, output analog gray-scale voltage at output terminal, voltage dividing signal at voltage dividing signal terminal is less than or equal to ½ of maximum load voltage at output terminal of digital-to-analog conversion circuit, amplification sub-circuit has amplification coefficient N greater than or equal to 2.

8 Claims, 6 Drawing Sheets

(58) Field of Classification Search
USPC .................................................. 341/159, 144
See application file for complete search history.

(56) References Cited

U.S. PATENT DOCUMENTS

| | | | | |
|---|---|---|---|---|
| 7,808,416 | B2* | 10/2010 | Tsuchi | G09G 3/3696 341/144 |
| 8,965,315 | B2* | 2/2015 | Balm | H03H 7/0153 455/195.1 |
| 10,236,904 | B1* | 3/2019 | Wang | G09G 3/3225 |
| 10,277,245 | B2* | 4/2019 | Wang | G09G 3/20 |
| 2006/0132344 | A1* | 6/2006 | Ishii | H03M 1/76 341/144 |
| 2008/0218456 | A1* | 9/2008 | Park | H03M 1/682 345/77 |
| 2008/0316074 | A1 | 12/2008 | Chida | |
| 2012/0286586 | A1* | 11/2012 | Balm | H03F 1/56 307/109 |
| 2013/0249567 | A1* | 9/2013 | Bai | G01R 27/2605 324/606 |
| 2018/0130392 | A1 | 5/2018 | Zhang et al. | |
| 2018/0358978 | A1* | 12/2018 | Wang | G09G 3/20 |

FOREIGN PATENT DOCUMENTS

| | | |
|---|---|---|
| CN | 101471663 A | 7/2009 |
| CN | 102314839 A | 1/2012 |
| CN | 103474015 A | 12/2013 |
| CN | 104821828 A | 8/2015 |
| CN | 106059590 A | 10/2016 |
| CN | 106330194 A | 1/2017 |
| CN | 107221278 A | 9/2017 |
| CN | 107274850 A | 10/2017 |
| CN | 109787635 A | 5/2019 |

* cited by examiner

DIGITAL-TO-ANALOG CONVERSION CIRCUIT, DIGITAL-TO-ANALOG CONVERSION METHOD, AND DISPLAY APPARATUS

CROSS-REFERENCE TO RELATED APPLICATION (S)

This application is a Section 371 National Stage Application of International Application No. PCT/CN2019/125623, which claims a priority to Chinese Application No. 201910024295.9 filed on Jan. 10, 2019, the contents of which are incorporated herein by reference in their entirety.

TECHNICAL FIELD

The embodiments of the present disclosure relate to a field of display technology, and in particular to a digital-to-analog conversion circuit, a display apparatus, and a digital-to-analog conversion method of the digital-to-analog conversion circuit.

BACKGROUND

AMOLEDs (Active-Matrix Organic Light-Emitting Diode) are more and more widely used.

With a development of high-definition television technology, requirements on the performance of DAC (Digital to Analog Converter) in video processors are also getting higher and higher. However, for a large-sized AMOLED source driver (driver chip), it is required to maintain the performance of the DAC while enable decoding structure related to the DAC to have a footprint as small as possible in an AMOLED driver chip.

SUMMARY

The present disclosure proposes a digital-to-analog conversion circuit.

According to a first aspect of embodiments of the present disclosure, there is provided a digital-to-analog conversion circuit, comprising: a voltage dividing sub-circuit comprising M voltage dividing signal terminals, wherein M is a natural number greater than 2; a decoding sub-circuit comprising M input terminals and an output terminal, wherein the M input terminals are electrically coupled to the first to $M^{th}$ voltage dividing signal terminals of the voltage dividing sub-circuit respectively, and the decoding sub-circuit is configured to receive a digital signal and select one of the M input terminals to be electrically connected with the output terminal according to the digital signal; an amplification sub-circuit comprising an input terminal and an output terminal, wherein the input terminal of the amplification sub-circuit is electrically coupled to the output terminal of the decoding sub-circuit, and the amplification sub-circuit is configured to amplify a signal at the input terminal of the amplification sub-circuit, and output an analog gray-scale voltage at its output terminal, wherein a voltage dividing signal at the voltage dividing signal terminal is less than or equal to ½ of a maximum load voltage at an output terminal of the digital-to-analog conversion circuit, and the amplification sub-circuit has an amplification coefficient N greater than or equal to 2.

For example, the amplification sub-circuit comprises: an operational amplifier comprising a positive input terminal, a negative input terminal, and an output terminal, wherein the positive input terminal is electrically coupled to the output terminal of the decoding sub-circuit; a first resistor, wherein a first terminal of the first resistor is electrically coupled to the negative input terminal of the operational amplifier, and a second terminal of the first resistor is grounded; a second resistor, wherein a first terminal of the second resistor is electrically coupled to the output terminal of the operational amplifier, and a second terminal of the second resistor is electrically coupled to the negative input terminal of the operational amplifier; wherein the second resistor has a resistance being (N−1) times over a resistance of the first resistor.

For example, the voltage dividing circuit further comprises: a resistor string comprising M resistors connected in series, each of the M resistors comprises a first terminal and a second terminal, and the first terminal of the $m^{th}$ resistor among the M resistors is electrically coupled to the $m^{th}$ voltage dividing signal terminal among the M voltage dividing signal terminals, and the second terminal of the $m^{th}$ resistor is electrically coupled to the first terminal of the $(m+1)^{th}$ resistor, wherein m is greater than or equal to 1 but less than M.

For example, the decoding sub-circuit is a switch network of a p-bit binary tree shape, each input terminal of the switch network is electrically coupled to the first to the $M^{th}$ voltage dividing signal terminals respectively, and the output terminal of the switch network is electrically coupled to the positive input terminal of the operational amplifier, wherein $M=2^p$.

For example, the switch network comprises: a P-channel metal oxide semiconductor field effect transistor and/or an N-channel metal oxide semiconductor field effect transistor.

According to a second aspect of the embodiments of the present disclosure, there is provided a display apparatus comprising the digital-to-analog conversion circuit of the embodiments of the present disclosure.

According to a third aspect of the embodiments of the present disclosure, there is provided a digital-to-analog conversion method for a digital-to-analog conversion circuit, comprising: receiving, by the decoding sub-circuit, a digital signal, and selecting the input terminal of the decoding sub-circuit which is to be electrically coupled to the output terminal of the decoding sub-circuit based on the digital signal; and outputting, by the amplification sub-circuit, the analog gray-scale voltage, wherein a voltage dividing signal at the voltage dividing signal terminal is less than or equal to ½ of a maximum load voltage at an output terminal of the digital-to-analog conversion circuit, and the amplification sub-circuit has an amplification coefficient greater than or equal to 2.

DETAILED DESCRIPTION

Figure 1:
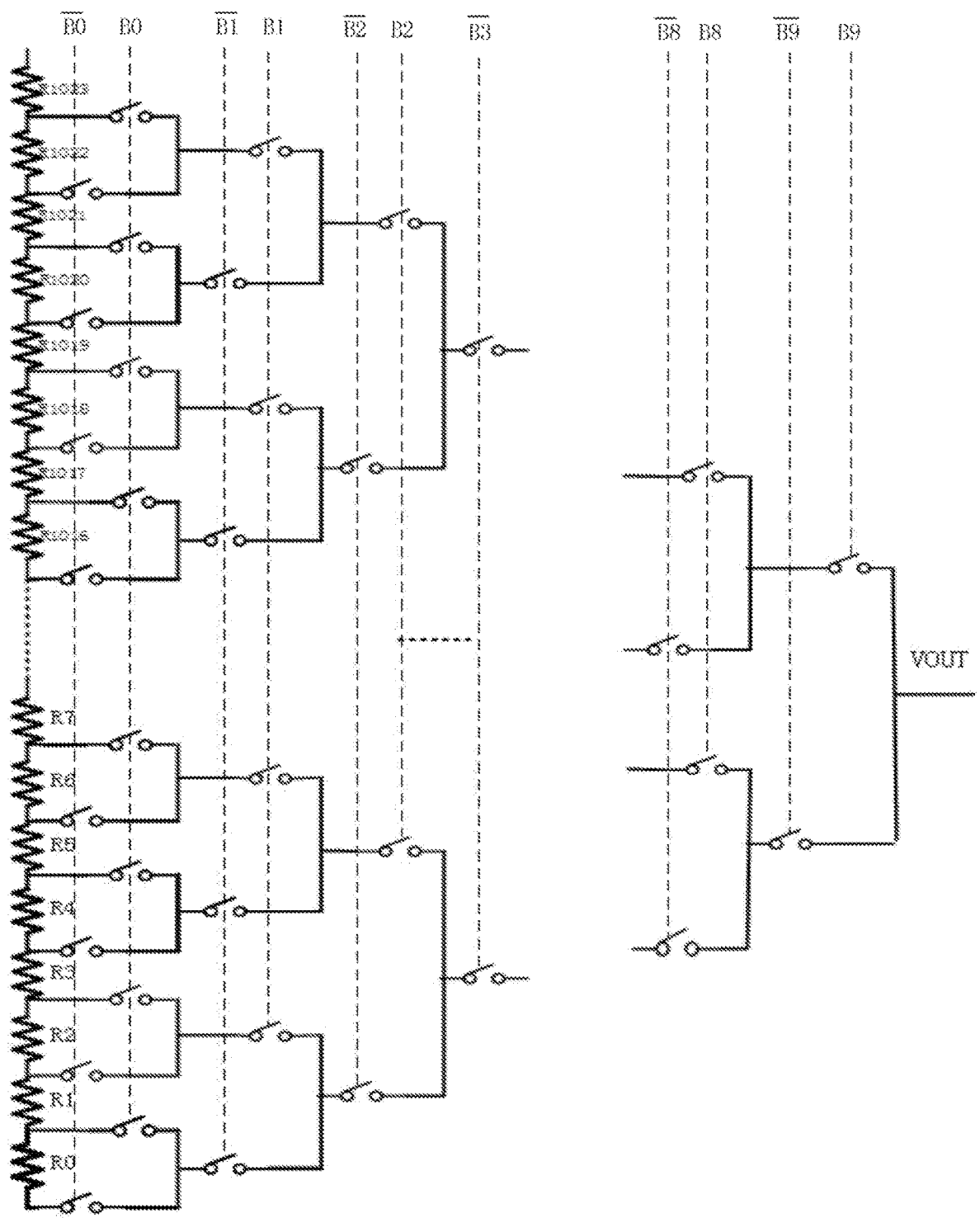
FIG. 1 is a schematic diagram of a resistor string based voltage dividing DAC with a 10-bit precision.

The embodiments of the present disclosure are described in detail below, and examples of the embodiments are shown in the drawings. Throughout the drawings, the same or similar reference numerals indicate the same or similar elements or elements having the same or similar functions. The embodiments described below with reference to the drawings are exemplary and are intended to explain the present disclosure, and should not be construed as limiting the present disclosure.

High-definition display technology usually requires a precision for digital-to-analog conversion to be above 10 bits, and the current DAC structures for video processing mainly comprise current steering DACs and resistor string based voltage division DACs. The current steering DACs have the characteristics of high speed and high precision. However, when the current steering DACs are applied to drive video transmission, in order to suppress signal reflection, the DAC output impedance is required to be equal to the characteristic impedance of the transmission line, that is, the source current being twice the signal circuit current, which leads to a large power consumption. The resistor string based voltage dividing DACs have the advantages of a simple structure, a small burr, and a good linearity. However, the precision of the resistor string based voltage dividing DAC is mainly determined by the matching of the resistor string. In general digital technology, the resistor string based voltage dividing DAC can only achieve an precision of about 8 bit.

For a large-size AMOLED source drivers (driver chips), there are hundreds or even thousands of DACs per column driving circuit, so that the area of the DAC has a great influence on the area of the entire driver chip. DAC occupies 60%-70% of the area of the entire driver chip. Therefore, it is necessary to optimize the DAC structure and reduce the area of the switches while ensuring the precision.

An implementation is to reduce the number of switches by optimizing the structure, thereby achieving the purpose of reducing the area. However, for CMOS (Complementary Metal Oxide Semiconductor), its minimum size is positively related to its withstand voltage. In other words, the larger the withstand voltage of a device is expected, the larger the minimum area will be. Since the range of the gray-scale voltage to be transmitted is wide, the withstand voltage of the switching device is required to be greater than the range of the gray-scale voltage, which results in limiting the size of the switching device to be small.

FIG. 1 is a schematic diagram of a resistor string based voltage dividing DAC with a 10-bit precision. As shown in FIG. 1, the resistor string based voltage dividing DAC with a 10-bit precision may comprise: a resistor string and a ten-bit binary switching network. Among them, the resistor string comprises 1024 resistors Rx (x=0, 1, 2, . . . , 1023) connected in series and having the same resistance, the resistor string comprises 1024 serial nodes, and the ten-bit binary selection switch network comprises 2046 switches. The serial nodes in the resistor string are respectively coupled to respective signal input terminals of the ten-bit binary selection switch network. The digital signals B0 to B9 select the corresponding reference voltage by controlling the ten-bit binary switch network to select the corresponding resistance from the resistor string, realizing the conversion from the digital signal to the analog signal.

The above-mentioned DAC input gray-scale voltage with a 10-bit precision is between VL and VH. For OLED applications, this voltage range is between 0V and 15V. Due to the wide range of the voltage to be transmitted, high voltage devices must be used for the switch. Thus, the present disclosure proposes a digital-to-analog conversion circuit, a digital-to-analog conversion method, and a display apparatus.

The display device, the digital-to-analog conversion circuit, and the digital-to-analog conversion method according to the embodiments of the present disclosure will be described below with reference to the drawings.

Figure 2:
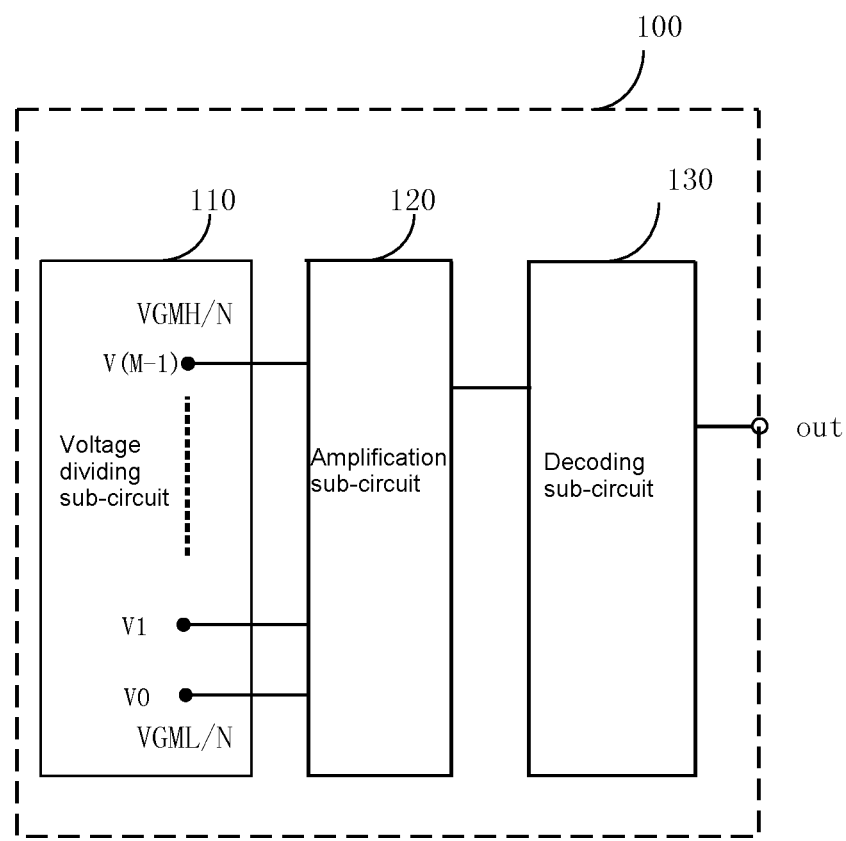
FIG. 2 is a structural diagram of a digital-to-analog conversion circuit according to an embodiment of the present disclosure.

FIG. 2 is a structural diagram of a digital-to-analog conversion circuit according to an embodiment of the present disclosure.

As shown in FIG. 2, the digital-to-analog conversion circuit 100 according to an embodiment of the present disclosure may comprise a voltage dividing sub-circuit 110, a decoding sub-circuit 120 and an amplification sub-circuit 130.

The voltage dividing sub-circuit 110 comprises M voltage dividing signal terminals. According to the order of the output voltages from low to high, the M voltage dividing signal terminals may comprise a first voltage dividing signal terminal V0 to the $M^t$ voltage dividing signal terminal V (M−1). The voltage dividing sub-circuit 110 receives a digital signal, and perform a voltage dividing process on the digital signal so as to provide M gray-scale voltages (voltage divided signals) at the voltage dividing signal terminals, wherein M is a natural number greater than 2.

The decoding sub-circuit 120 comprises M input terminals and an output terminal. The M input terminals of the decoding sub-circuit 120 are respectively coupled to the first voltage dividing signal terminal V0 to the $M^{th}$ voltage dividing signal terminal V (M−1) of the voltage dividing sub-circuit 110. The decoding sub-circuit 120 is configured to receive the digital signal (i.e., one of the M gray-scale voltages) via M input terminals, and select one of the M input terminals to be electrically connected with the output terminal of the decoding sub-circuit according to the digital signal.

In one example, the decoding sub-circuit 120 may be implemented as a switch network of a p-bit binary tree shape comprising a plurality of switches. Each input terminal of the switching network is coupled to the first voltage dividing signal terminal V0 to the $M^{th}$ voltage dividing signal terminal V (M−1), and the output terminal of the switching network is coupled to the amplification sub-circuit 130, wherein M=$2^p$. The voltage of the analog signal output by the decoding circuit 120 is one of M gray-scale voltages, and p is a natural number. In the example, the switch in the switch network may comprise: a P-channel metal oxide semiconductor field effect transistor and/or an N-channel metal oxide semiconductor field effect transistor.

For example, referring to FIG. 1, if p=10, the digital signal is a 10-bit binary sequence B9B8B7B6B5B4B3B2B1B0, B0~B9=0 or 1, wherein B0 is the $1^{st}$ digit of the digital signal, B1 is the $2^{nd}$ digit of the digital signal, B2 is the $3^{rd}$ digit of the digital signal, . . . , and B9 is the $10^{th}$ digit of the digital signal. At this time, the decoding sub-circuit 120 converts the $1^{st}$~$10^{th}$ digits of the digital signal, M=$2^p$=1024, and the analog voltage output by the decoding sub-circuit 120 is one of 1024 gray-scale voltages. Assuming that the switch is turned off when the switch control signal is 0, and the switch is turned on when the switch control signal is 1.

When B9B8B7B6B5B4B3B2B1B0 is 0000000000, 0000000001, . . . , 1111111110, 1111111111, the analog signals output by the decoding sub-circuit 120 are gray-scale voltages corresponding to the voltage dividing signal terminals V0, V1, . . . , V1022, V1023.

The amplification sub-circuit 130 is coupled to the output terminal of the decoding sub-circuit 120. The amplification sub-circuit 130 comprises an input terminal and an output terminal. The input terminal of the amplification sub-circuit 130 is electrically coupled to the output terminal of the decoding sub-circuit 120, and the amplification sub-circuit is configured to amplify a signal at its input terminal, and output an analog gray-scale voltage at its output terminal. Among others, a voltage dividing signal at the voltage dividing signal terminal of the voltage dividing sub-circuit 120 is less than or equal to ½ of a maximum load voltage at an output terminal of the digital-to-analog conversion circuit, and the amplification sub-circuit has an amplification coefficient greater than or equal to 2.

It can be understood that the decoding sub-circuit 120 may be a binary switch tree structure or other optimized circuits, which is not limited herein.

In the embodiment, the analog signal output from the decoding sub-circuit is amplified by the amplification sub-circuit, so as to obtain an analog signal corresponding to an original data signal. Therefore, the switch in the decoding sub-circuit can operate at a low power supply voltage, so that the decoding sub-circuit can use a small-sized switch, reducing the area and cost of the digital-to-analog conversion circuit meanwhile outputting the analog gray scale voltage within a normal range.

According to the embodiments of the present disclosure, the analog signal output from the decoding sub-circuit is amplified by the amplification sub-circuit, so as to obtain an analog signal corresponding to an original data signal. Since the voltage dividing signal at the voltage dividing signal terminal of the voltage dividing sub-circuit is less than or equal to ½ of the maximum load voltage at the output terminal of the digital-to-analog conversion circuit, it is possible for the switch in the decoding sub-circuit to operate at a lower power supply voltage, and the gray-scale voltage can be amplified by the amplification sub-circuit proportionally, so that the area of the driving chip is reduced by reducing the area of the decoding sub-circuit, thereby saving costs.

Figure 3:
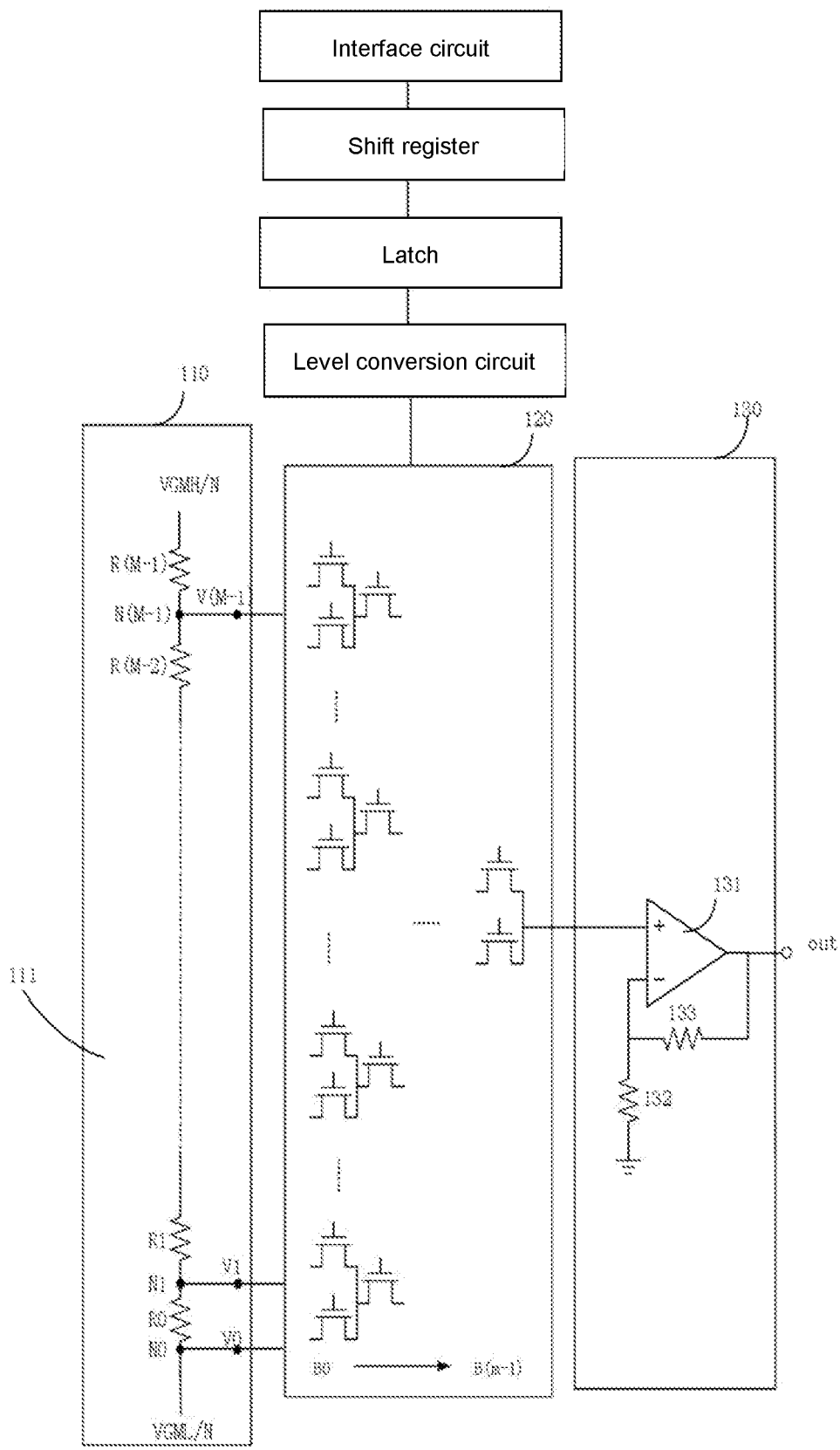
FIG. 3 is a schematic diagram of the digital-to-analog conversion circuit according to an embodiment of the present disclosure.

In one embodiment of the present disclosure, as shown in FIG. 3, the amplification sub-circuit 130 comprises an operational amplifier 131, a first resistor 132 and a second resistor 133. The operational amplifier 131 may comprise a positive input terminal (+), a negative input terminal (−), and an output terminal.

Among others, the positive input terminal of the operational amplifier 131 is coupled to the output terminal of the decoding sub-circuit 120, and the output terminal of the operational amplifier 131 is coupled to the analog signal output terminal (out) of the digital-to-analog conversion circuit 100. The first terminal of the first resistor 132 is coupled to the negative input terminal of the operational amplifier 131, and the second terminal of the first resistor 132 is grounded. The first terminal of the second resistor 133 is coupled to the output terminal of the operational amplifier 131, and the second terminal of the second resistor 133 is coupled to the negative input terminal of the operational amplifier 131, wherein the resistance of the second resistor 133 may be (N−1) times over the resistance of the first resistor 132. Therefore, the analog gray-scale voltage output from the output terminal of the operational amplifier 131 is:

analog gray scale voltage=(1+the resistance of the second resistor/the resistance of the first resistor)*analog voltage output from the decoding sub-circuit120=[1+(N−1)]*the voltage of the analog signal=N*the voltage of the analog signal.

Thus, by adjusting the relationship between the resistances of the first resistor and the second resistor, the output analog gray-scale voltage can be ensured within a normal range even if the input analog signal voltage is small.

In one embodiment of the present disclosure, as shown in FIG. 3, the voltage dividing sub-circuit 110 may comprise a resistor string 111, which comprises M resistors Rx connected in series (x=1, 1, 2, . . . , M). Each of the M resistors comprises a first terminal and a second terminal, and the first terminal of the m$^{th}$ resistor among the M resistors is electrically coupled to the m$^{th}$ voltage dividing signal terminal among the M voltage dividing signal terminals, and the second terminal of the m$^{th}$ resistor is electrically coupled to the first terminal of the (m+1)$^{th}$ resistor, wherein m is greater than or equal to 1 but less than M. For example, the first terminal of the first resistor R0 in the resistor string 111 can input the minimum of the gray scale voltage VGML/N, and the second terminal of the M$^{th}$ resistor R(M−1) can input the maximum of the gray scale voltage VGMH/N. VGMH/N and VGML/N may be 1/N times over VH and VL in the technical solution shown in FIG. 1, respectively.

The working principle of the digital-to-analog conversion circuit of the embodiment of the present disclosure will be described below with reference to FIG. 3 and FIG. 4.

Figure 4:
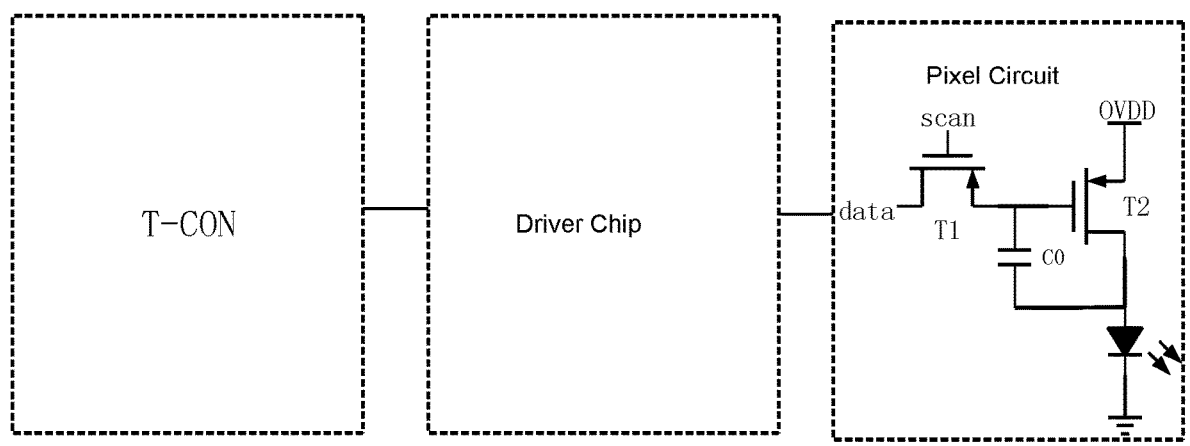
FIG. 4 is a schematic diagram of a display apparatus according to an embodiment of the present disclosure.

As shown in FIG. 3 and FIG. 4, the driver chip of the display apparatus may comprise an interface circuit, a control circuit, a shift register, a latch, a level conversion circuit, and the digital-to-analog conversion circuit 100 of the present disclosure.

Referring to FIG. 3 and FIG. 4, the input signal transmits the data provided by a timing controller T-CON to the shift register through the interface circuit and the control circuit, and then to the latch. After all the data of pixels in one row are received, they are sent to the level conversion circuit in the next stage. Since the previous part usually works at a low voltage (such as 1.8V or 3.3V), the subsequent digital-to-analog conversion circuit 100 is required to output the analog gray-scale voltages with a wide range (a dozen volts for a large-size driving applications).

The maximum VGMH/N and the minimum VGML/N of the gray-scale voltage are input to both terminals of the resistor string 111 respectively, and the VGMH/N and VGML/N may be 1/N times over the VH and VL in the technical solution shown in FIG. 1 respectively. A corresponding analog signal is output by the decoding sub-circuit 120 under the control of the digital signal, and the voltage of the analog signal is then amplified by the amplification sub-circuit 130 proportionally, thereby restoring the output value to a normal value, that is, N*the voltage of analog signal, in order to drive a pixel circuit in a panel.

Since the voltage dividing signal at the voltage dividing signal terminal of the voltage dividing sub-circuit is less than or equal to ½ of the maximum load voltage at the output terminal of the digital-to-analog conversion circuit, the range of the gray-scale voltages to be transmitted is reduced, so that the withstand voltage of the switch in the decoding sub-circuit becomes smaller, and the decoding sub-circuit 120 can be powered by a smaller power supply voltage (for example, 5V). Therefore, it is possible to use a small-sized switch, thereby reducing the area and costs of the digital-to-analog conversion circuit. In addition, switches with a smaller on-resistance and a small parasitic capacitance can be used, thereby reducing the delay of the digital-to-analog conversion circuit and improving the conversion speed. Thus, it is suitable for high speed data processing.

The digital-to-analog conversion circuit according to the embodiments of the present disclosure may reduce the withstand voltage of the switch devices. Since the voltage dividing signal at the voltage dividing signal terminal of the voltage dividing sub-circuit is less than or equal to ½ of the maximum load voltage at the output terminal of the digital-to-analog conversion circuit, it is possible for the switch in the decoding sub-circuit to operate at a lower power supply voltage, and the gray-scale voltage can be amplified by the amplification sub-circuit proportionally, so that the area of the driving chip is reduced by reducing the area of the decoding sub-circuit, thereby saving costs.

Further, the present disclosure proposes a display apparatus.

Figure 5:
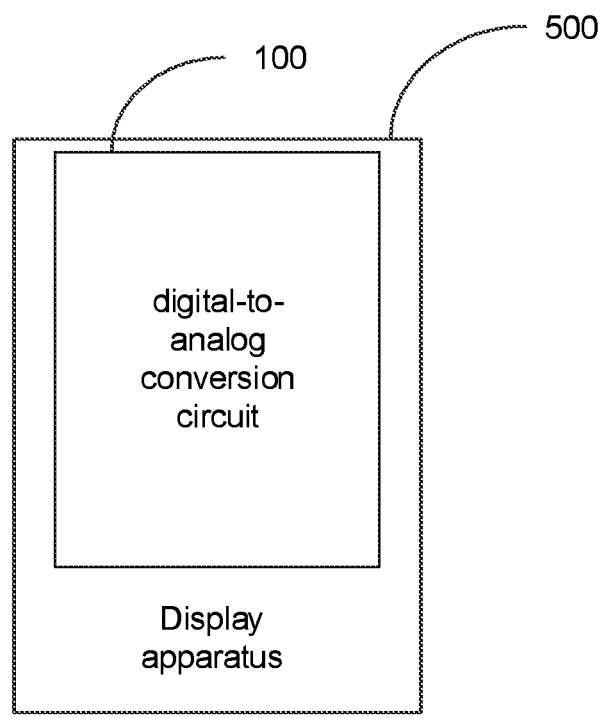
FIG. 5 is a block diagram of the display apparatus according to an embodiment of the present disclosure.

FIG. 5 is a block diagram of the display apparatus according to an embodiment of the present disclosure. As shown in FIG. 5, the display apparatus 500 comprises the digital-to-analog conversion circuit 100 according to the embodiment.

Based on the digital-to-analog conversion circuit of the above embodiment, the present disclosure also proposes a digital-to-analog conversion method for a digital-to-analog conversion circuit.

Figure 6:
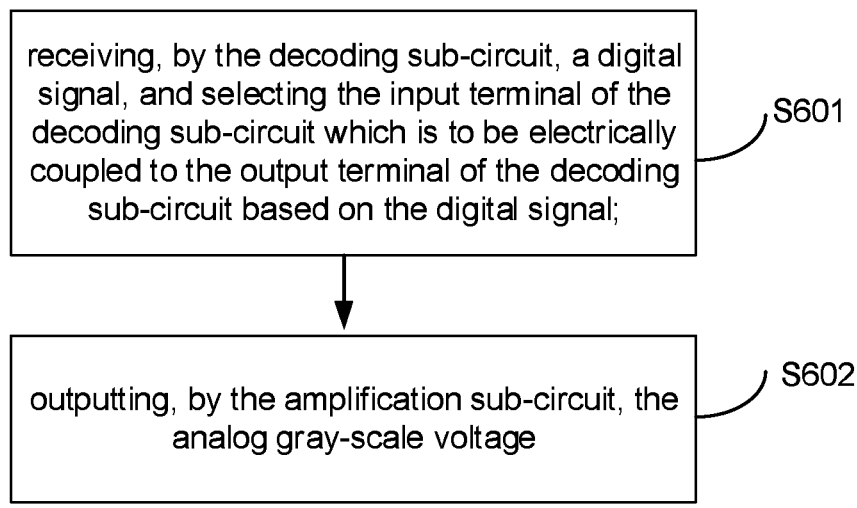
FIG. 6 is a flowchart diagram of a digital-to-analog conversion method for the digital-to-analog conversion circuit according to an embodiment of the present disclosure.

FIG. 6 is a flowchart diagram of a digital-to-analog conversion method for the digital-to-analog conversion circuit according to an embodiment of the present disclosure. As shown in FIG. 6, the digital-to-analog conversion method comprises the following steps.

At S601, the decoding sub-circuit receives a digital signal, and selects the input terminal of the decoding sub-circuit which is to be electrically coupled to the output terminal of the decoding sub-circuit based on the digital signal.

At S602, the analog gray scale voltage is ouput by the amplification sub-circuit, wherein the voltage dividing signal at the voltage dividing sub-circuit is less than or equal to ½ of the maximum load voltage at the output terminal of the digital-to-analog conversion circuit, and the amplification sub-circuit has the amplification coefficient N greater than or equal to 2.

It should be noted that other specific implementations of the digital-to-analog conversion method according to the embodiments of the present disclosure may referred to the specific implementations of the digital-to-analog conversion circuit of the foregoing embodiments of the present disclosure.

It should be noted that the logic and/or steps represented in the flowchart or described in other ways here, for example, can be regarded as a sequenced list of executable instructions for implementing logical functions, which can be specifically implemented in any computer readable medium, so as to be used by an instruction execution system, apparatus, or device (such as a computer-based system, a system comprising a processor, or other systems that can fetch and execute instructions from the instruction execution system, apparatus, or device), or be used in combination with these instruction execution system, device or device. With respect to this specification, a "computer-readable medium" may be any device that can contain, store, communicate, propagate, or transmit programs to be used by the instruction execution system, apparatus, or device, or programs to be used in connection with these instruction execution system, apparatus, or device. More specific examples of computer-readable media (non-exhaustive list) comprise: electrical connection portions (electronic devices) with one or more wires, portable computer cartridges (magnetic devices), random access memory (RAM), read only memory (ROM), erasable and editable read only memory (EPROM or flash memory), fiber optic devices, and portable compact disk read only memory (CDROM). In addition, the computer-readable medium may even be paper or other suitable medium on which the program can be printed, because, for example, by optically scanning the paper or other medium, followed by editing, interpretation, or other appropriate process if necessary, the program can be electronically obtained, and then stored in a computer memory.

It should be understood that various parts of the present disclosure may be implemented in hardware, software, firmware, or a combination thereof. In the above embodiments, multiple steps or methods may be implemented with software or firmware stored in memory and executed by a suitable instruction execution system. For example, if they are implemented with hardware, as in another embodiment, it can be implemented with any of the following techniques known in the art or a combination thereof: discrete logic circuits having a logic gate circuit for implementing a logic function on a data signal, dedicated integrated circuits with appropriate combinational logic gates, programmable gate arrays (PGA), field programmable gate arrays (FPGA), etc.

In the description of this specification, the description referring to the terms of "one embodiment", "some embodiments", "examples", "specific examples", or "some examples" means specific features, structures, materials or characteristics described in conjunction with the embodiment or examples may be comprised in at least one embodiment or example of the present disclosure. In this specification, the schematic expression of the above terms does not necessarily refer to the same embodiment or example. Moreover, the specific features, structures, materials, or characteristics described may be combined in any suitable manner in any one or more embodiments or examples.

In addition, the terms of "first" and "second" are used for description purposes only, and cannot be understood as indicating or implying relative importance or implicitly indicating the number of technical features indicated. Thus, the features defined with "first" and "second" may comprise at least one of the features either explicitly or implicitly. In the description of the present disclosure, the meaning of "a plurality of . . . " refers to at least two, for example, two, three, etc., unless specifically defined otherwise.

In this disclosure, unless otherwise clearly specified and limited, the terms of "installation", "coupled to", "connected with", "fixed to" and the like should be understood in a broad sense, for example, it can be a fixedly connected or detachably connected, or integrated; may be mechanically connected or electrically connected; may be directly connected, or may be indirectly connected through an intermediary, may be a connection between two components or an interaction between two components, unless otherwise defined. Those skilled in the art can understand the specific meanings of the above terms in the present disclosure depending on specific situations.

Although the embodiments of the present disclosure have been shown and described above, it is understood that the above-described embodiments are exemplary and should not be construed as limiting the present disclosure. Those of ordinary skill in the art may make changes, modifications, substitutions, and variations to the above-described embodiments within the scope of the present disclosure.

We claim:

1. A digital-to-analog conversion circuit, comprising:
   a voltage dividing sub-circuit comprising M voltage dividing signal terminals, wherein M is a natural number greater than 2;
   a decoding sub-circuit comprising M input terminals and an output terminal, wherein the M input terminals are electrically coupled to the first to $M^{th}$ voltage dividing signal terminals of the voltage dividing sub-circuit respectively, and the decoding sub-circuit is configured to receive a digital signal and select one of the M input terminals to be electrically connected with the output terminal according to the digital signal; and
   an amplification sub-circuit comprising an input terminal and an output terminal, wherein the input terminal of the amplification sub-circuit is electrically coupled to the output terminal of the decoding sub-circuit, and the amplification sub-circuit is configured to amplify a signal at its input terminal, and output an analog gray-scale voltage at its output terminal, the amplification sub-circuit comprises:
      an operational amplifier comprising a positive input terminal, a negative input terminal, and an output terminal, wherein the positive input terminal is electrically coupled to the output terminal of the decoding sub-circuit, and the output terminal of the operational amplifier is electrically coupled to the output terminal of the decoding sub-circuit;
      a first resistor, wherein a first terminal of the first resistor is electrically coupled to the negative input terminal of the operational amplifier, and a second terminal of the first resistor is grounded; and
      a second resistor, wherein a first terminal of the second resistor is electrically coupled to the output terminal of the operational amplifier, and a second terminal of the second resistor is electrically coupled to the negative input terminal of the operational amplifier;
   wherein a voltage dividing signal at the voltage dividing signal terminal is less than or equal to ½ of a maximum load voltage at an output terminal of the digital-to-analog conversion circuit, the amplification sub-circuit has an amplification coefficient N greater than or equal to 2, and the second resistor has a resistance being (N−1) times over a resistance of the first resistor.

2. The digital-to-analog conversion circuit of claim 1, wherein the voltage dividing sub-circuit further comprises:
   a resistor string comprising M resistors connected in series, each of the M resistors comprises a first terminal and a second terminal, and the first terminal of the $m^{th}$ resistor among the M resistors is electrically coupled to the $m^{th}$ voltage dividing signal terminal among the M voltage dividing signal terminals, and the second terminal of the $m^{th}$ resistor is electrically coupled to the first terminal of the $(m+1)^{th}$ resistor, wherein m is greater than or equal to 1 but less than M.

3. The digital-to-analog conversion circuit of claim 2, wherein the decoding sub-circuit comprises a switch network of a p-bit binary tree shape comprising a plurality of switches, and each input terminal of the switch network is electrically coupled to the first to the $M^{th}$ voltage dividing signal terminals respectively, and the output terminal of the switch network is electrically coupled to the positive input terminal of the operational amplifier, wherein $M=2^p$.

4. The digital-to-analog conversion circuit of claim 1, wherein the decoding sub-circuit comprises a switch network of a p-bit binary tree shape comprising a plurality of switches, and each input terminal of the switch network is electrically coupled to the first to the $M^{th}$ voltage dividing signal terminals respectively, and the output terminal of the switch network is electrically coupled to the positive input terminal of the operational amplifier, wherein $M=2^p$.

5. The digital-to-analog conversion circuit of claim 4, wherein switches in the switch network comprise: a P-channel metal oxide semiconductor field effect transistor and an N-channel metal oxide semiconductor field effect transistor.

6. The digital-to-analog conversion circuit of claim 4, wherein switches in the switch network comprise: a P-channel metal oxide semiconductor field effect transistor or an N-channel metal oxide semiconductor field effect transistor.

7. A display apparatus comprising the digital-to-analog conversion circuit of claim 1.

8. A digital-to-analog conversion method for a digital-to-analog conversion circuit, comprising: a voltage dividing sub-circuit comprising M voltage dividing signal terminals, wherein M is a natural number greater than 2; a decoding sub-circuit comprising M input terminals and an output terminal, wherein the M input terminals are electrically coupled to the first to $M^{th}$ voltage dividing signal terminals of the voltage dividing sub-circuit respectively, and the decoding sub-circuit is configured to receive a digital signal and select one of the M input terminals to be electrically connected with the output terminal according to the digital signal; and an amplification sub-circuit comprising an input terminal and an output terminal, wherein the input terminal of the amplification sub-circuit is electrically coupled to the output terminal of the decoding sub-circuit, and the amplification sub-circuit is configured to amplify a signal at its input terminal, and output an analog gray-scale voltage at its output terminal, the amplification sub-circuit comprises: an operational amplifier comprising a positive input terminal, a negative input terminal, and an output terminal, wherein the positive input terminal is electrically coupled to the output terminal of the decoding sub-circuit, and the output terminal of the operational amplifier is electrically coupled to the output terminal of the decoding sub-circuit; a first resistor, wherein a first terminal of the first resistor is electrically coupled to the negative input terminal of the operational amplifier, and a second terminal of the first resistor is grounded; a second resistor, wherein a first terminal of the second resistor is electrically coupled to the output terminal of the operational amplifier, and a second terminal of the second resistor is electrically coupled to the negative input terminal of the operational amplifier wherein the second resistor has a resistance being (N−1) times over a resistance of the first resistor, the method comprising:
   receiving, by the decoding sub-circuit, a digital signal, and selecting the input terminal of the decoding sub-circuit which is to be electrically coupled to the output terminal of the decoding sub-circuit based on the digital signal; and
   outputting, by the amplification sub-circuit, the analog gray-scale voltage,
   wherein the voltage dividing signal at the voltage dividing sub-circuit is less than or equal to ½ of the maximum load voltage at the output terminal of the digital-to-analog conversion circuit, and the amplification sub-circuit has the amplification coefficient N greater than or equal to 2.

* * * * *